United States Patent
Chen et al.

(10) Patent No.: US 9,842,765 B2
(45) Date of Patent: Dec. 12, 2017

(54) SEMICONDUCTOR DEVICE STRUCTURE AND METHOD FOR FORMING THE SAME

(71) Applicant: Taiwan Semiconductor Manufacturing Co., Ltd, Hsin-Chu (TW)

(72) Inventors: Wei-Ting Chen, Hsin-Chu (TW); Che-Cheng Chang, New Taipei (TW); Chen-Hsiang Lu, Hsin-Chu (TW); Yu-Cheng Liu, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 199 days.

(21) Appl. No.: 14/658,525

(22) Filed: Mar. 16, 2015

(65) Prior Publication Data
US 2016/0276271 A1    Sep. 22, 2016

(51) Int. Cl.
*H01L 21/768* (2006.01)
*H01L 21/311* (2006.01)
*H01L 23/532* (2006.01)

(52) U.S. Cl.
CPC .. *H01L 21/76804* (2013.01); *H01L 21/31116* (2013.01); *H01L 21/31138* (2013.01); *H01L 21/31144* (2013.01); *H01L 21/76811* (2013.01); *H01L 21/76816* (2013.01); *H01L 23/53295* (2013.01); *H01L 21/76832* (2013.01)

(58) Field of Classification Search
None
See application file for complete search history.

(56) References Cited

U.S. PATENT DOCUMENTS

| | | |
|---|---|---|
| 5,620,925 A | 4/1997 | Nakata et al. |
| 6,177,347 B1 | 1/2001 | Liu et al. |
| 6,713,873 B1 | 3/2004 | O'Loughlin et al. |
| 7,259,463 B2 | 8/2007 | Huang et al. |
| 8,314,026 B2 | 11/2012 | Uehling |
| 8,629,058 B2 | 1/2014 | Shue et al. |
| 8,673,765 B2 | 3/2014 | Wang et al. |
| 8,946,004 B2 | 2/2015 | Kim et al. |
| 9,214,424 B2 * | 12/2015 | Stecher ............... H01L 23/5225 |
| 9,385,079 B2 | 7/2016 | Chang et al. |
| 2004/0175929 A1 | 9/2004 | Schmitt et al. |
| 2008/0026564 A1 | 1/2008 | Frohberg et al. |

OTHER PUBLICATIONS

U.S. Office Action dated Jun. 16, 2017, for U.S. Appl. No. 14/659,170.

* cited by examiner

*Primary Examiner* — Charles Garber
*Assistant Examiner* — Krista Soderholm
(74) *Attorney, Agent, or Firm* — Birch, Stewart, Kolasch & Birch, LLP (57) ABSTRACT

A semiconductor device structure is provided. The semiconductor device structure includes a substrate. The semiconductor device structure includes a dielectric layer over the substrate. The dielectric layer has a trench. The semiconductor device structure includes a conductive line in the trench. The conductive line has a first end portion and a second end portion. The first end portion faces the substrate. The second end portion faces away from the substrate. A first width of the first end portion is greater than a second width of the second end portion.

20 Claims, 13 Drawing Sheets

SEMICONDUCTOR DEVICE STRUCTURE AND METHOD FOR FORMING THE SAME

CROSS REFERENCE TO RELATED APPLICATIONS

This application is related to the co-pending and commonly assigned application Ser. No. 14/659,170 filed on Mar. 16, 2015 and entitled "SEMICONDUCTOR DEVICE STRUCTURE AND METHOD FOR FORMING THE SAME", the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Figure 1A:
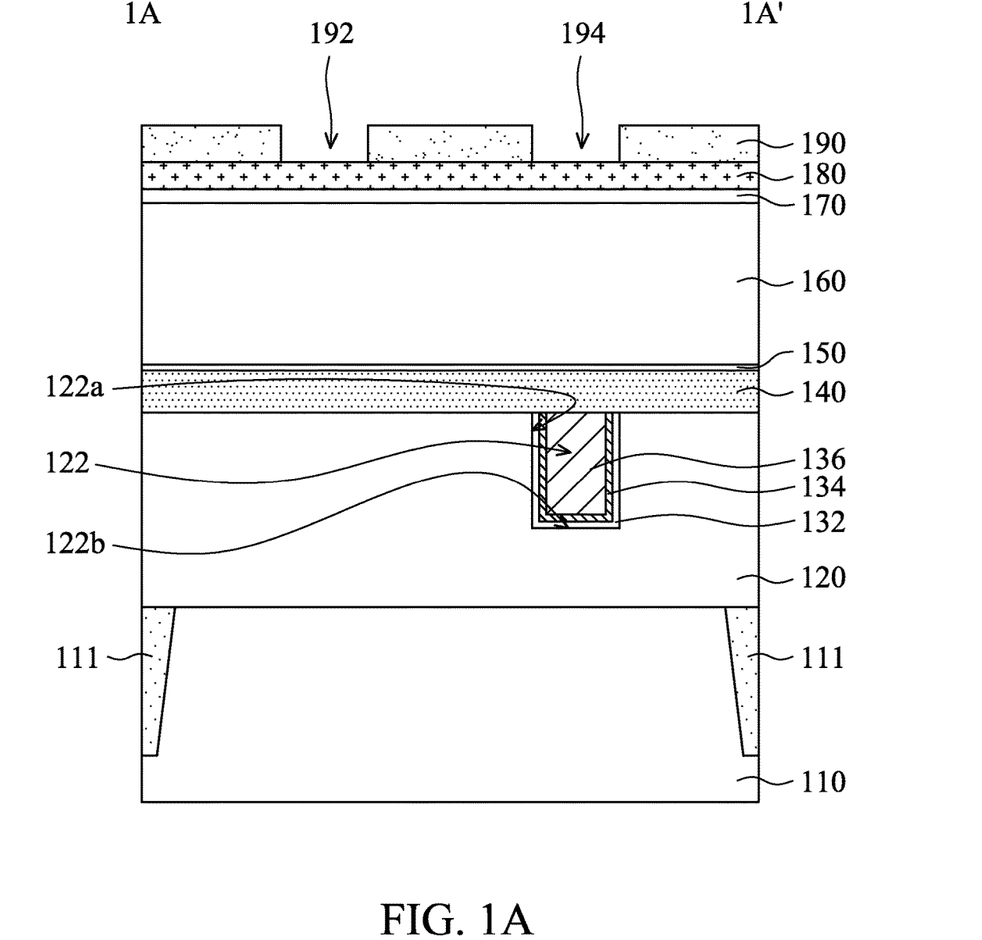
FIGS. 1A-1H are cross-sectional views of various stages of a process for forming a semiconductor device structure, in accordance with some embodiments.
Figure 1B:
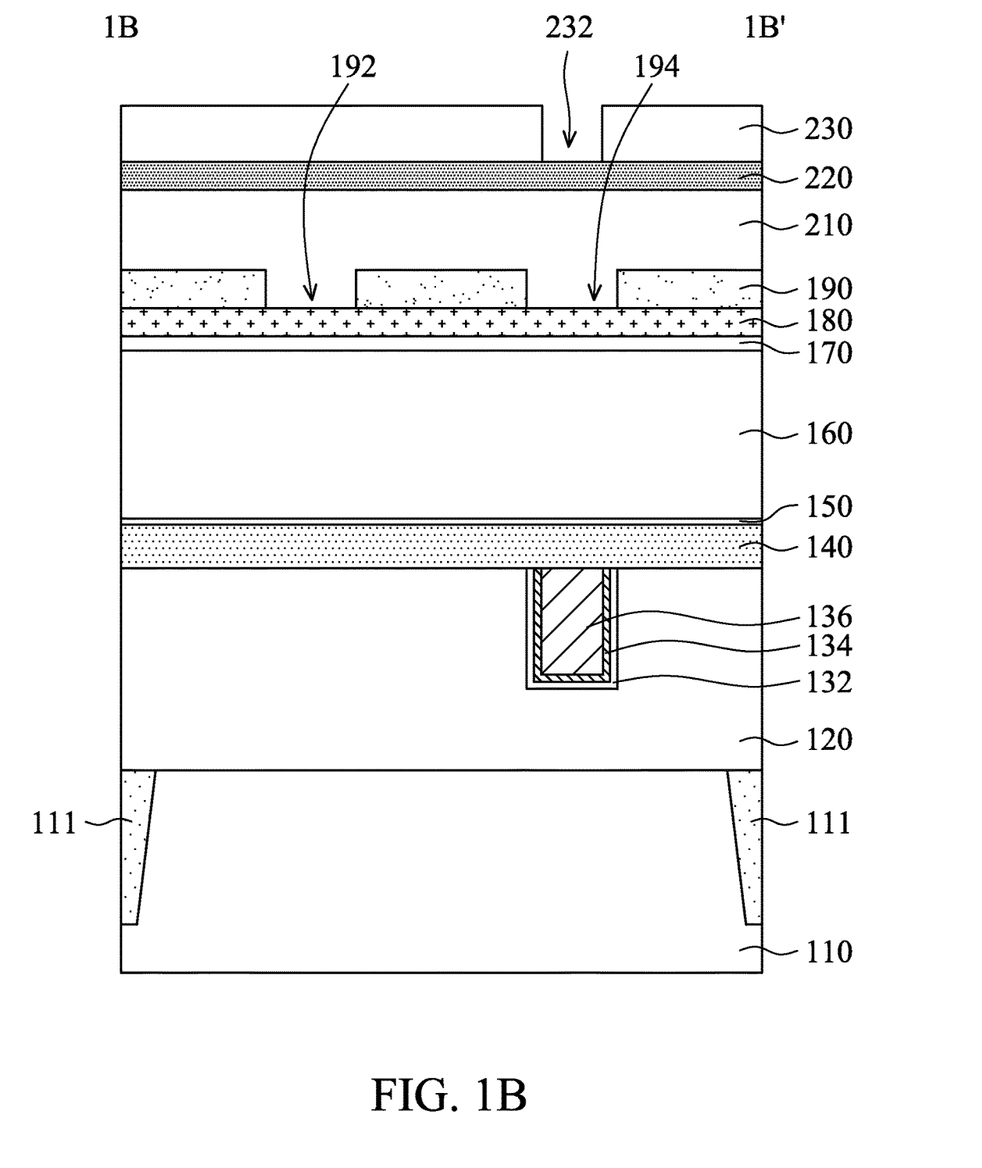
Figure 1C:
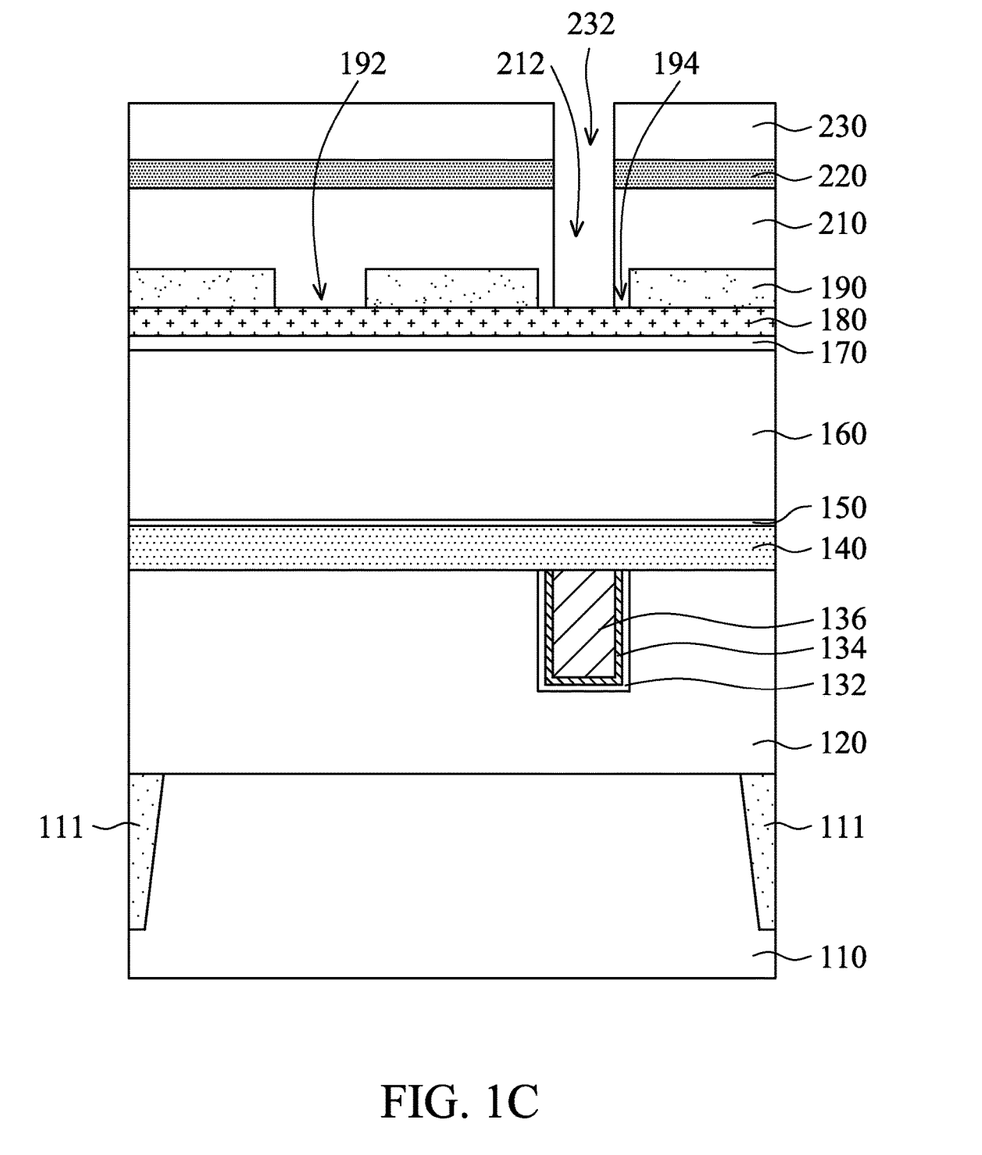
Figure 1D:
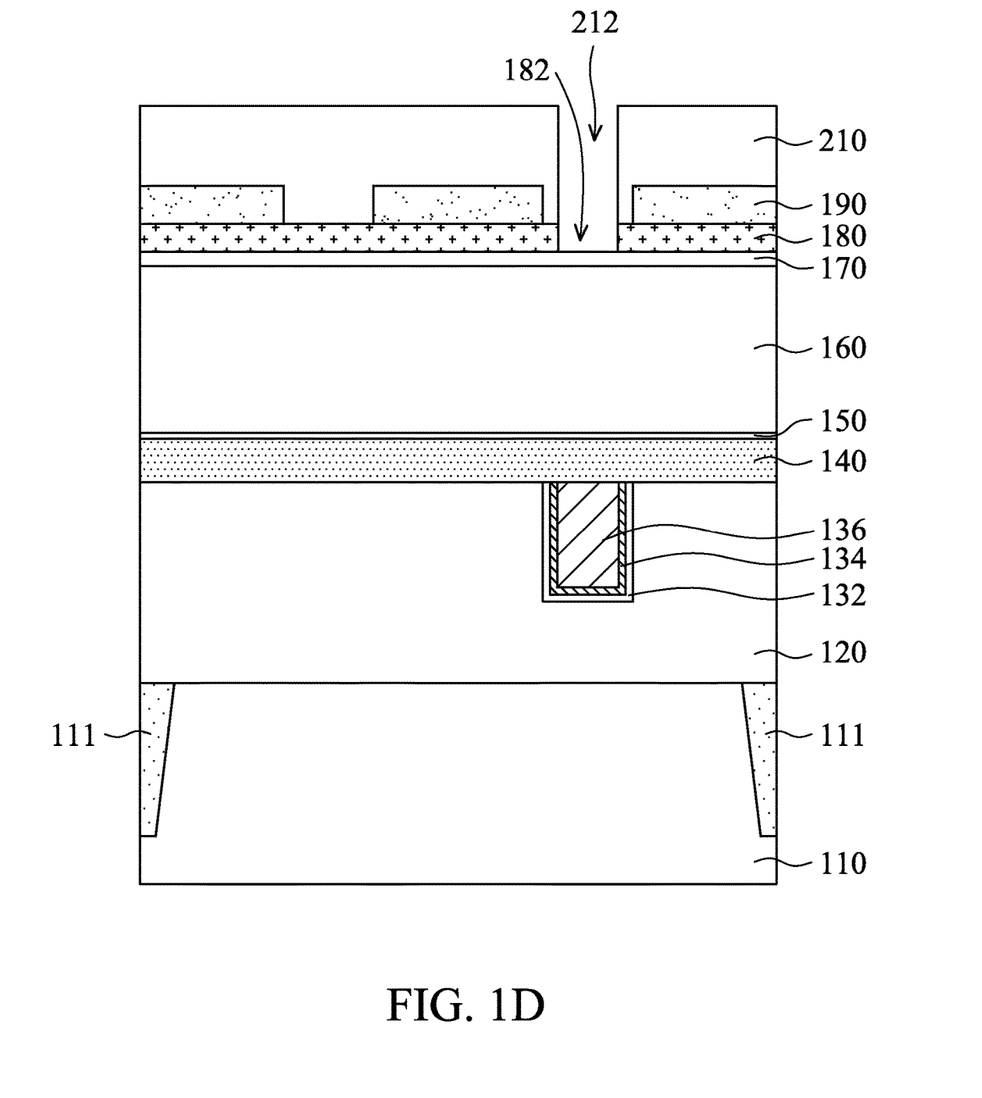
Figure 1E:
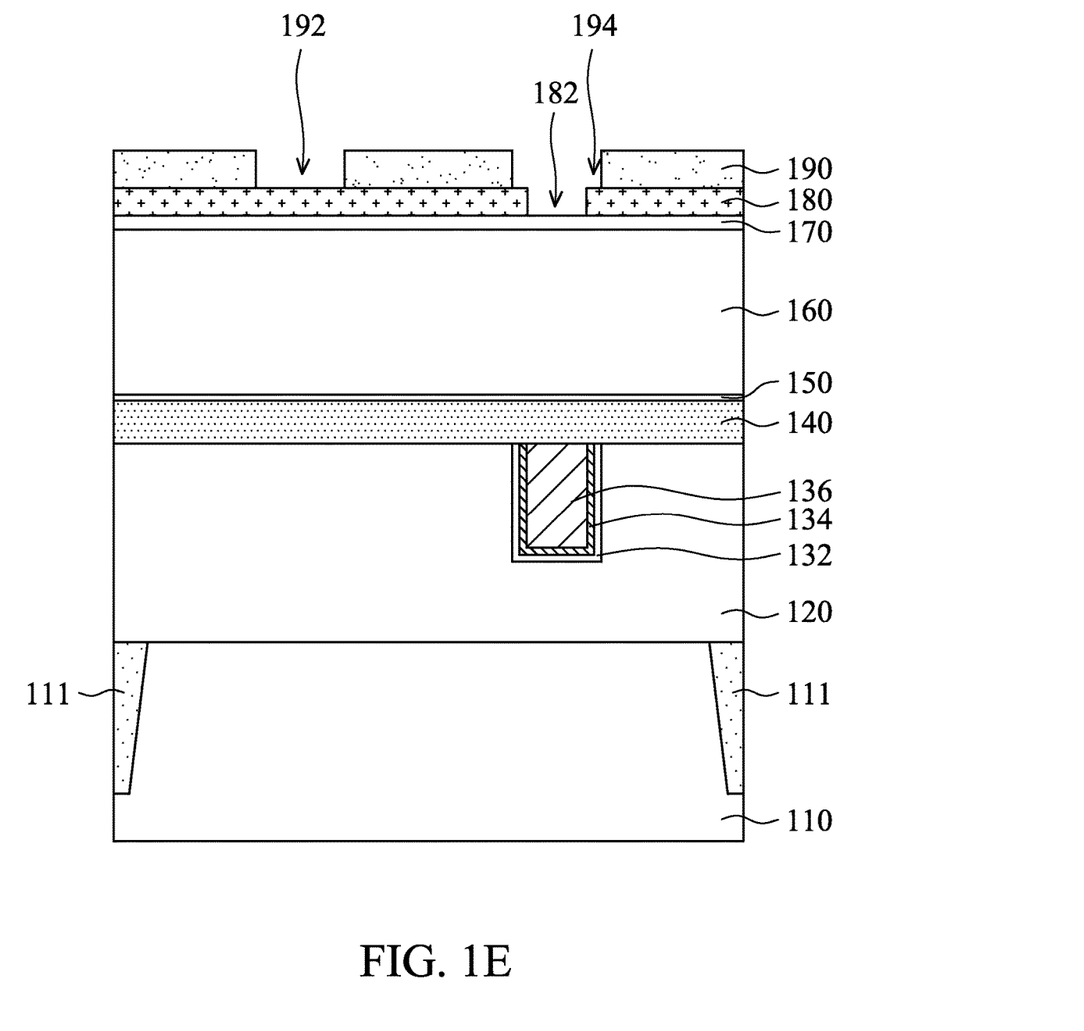
Figure 1F:
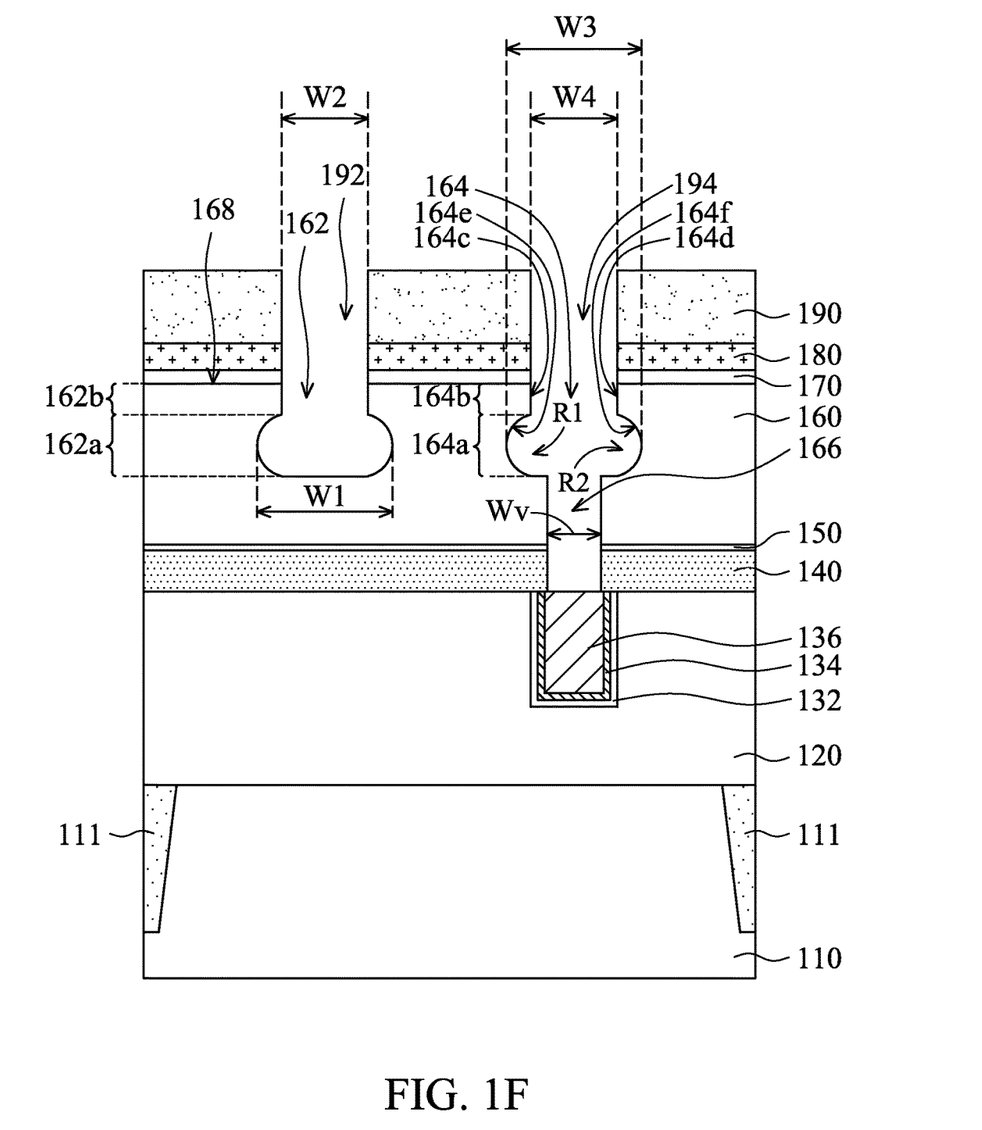
Figure 1G:
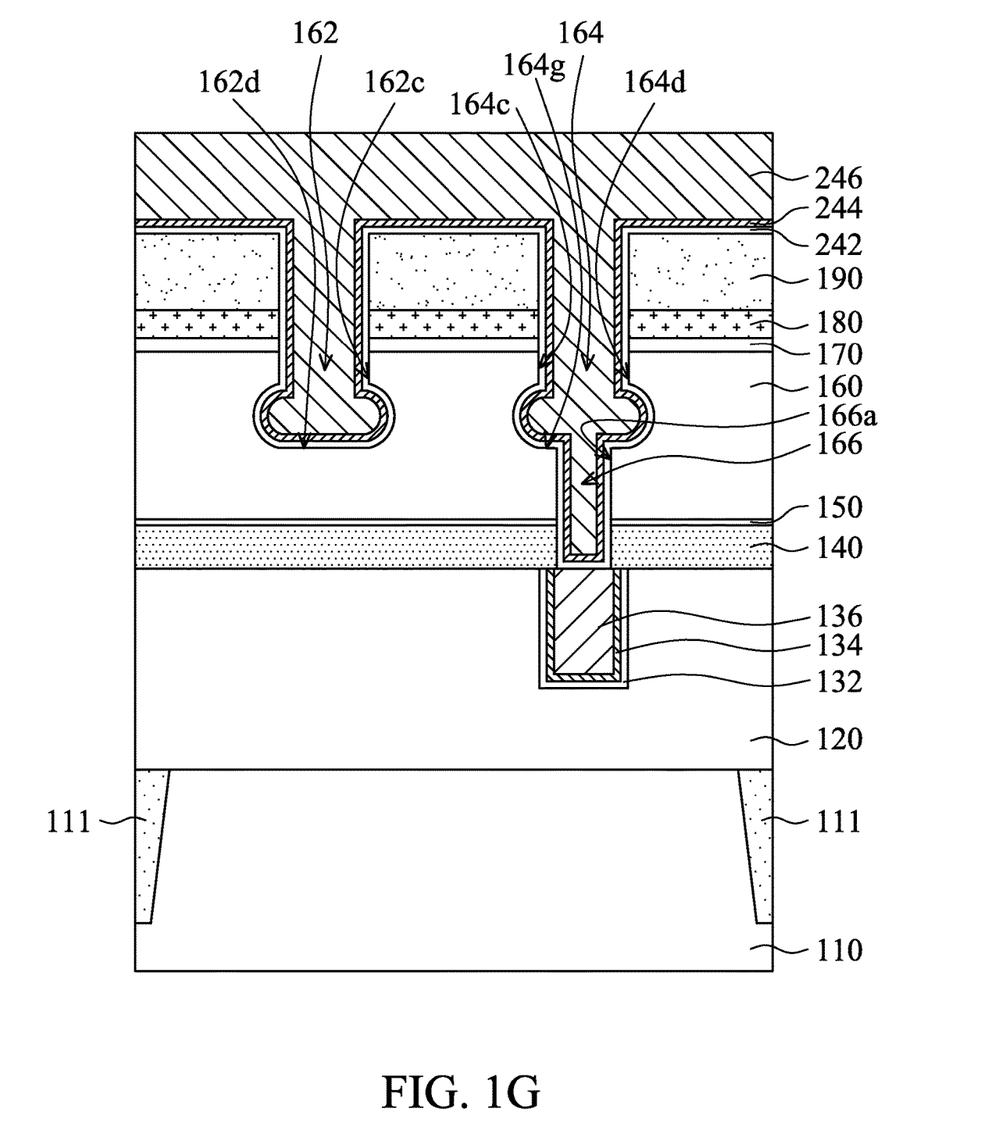
Figure 1H:
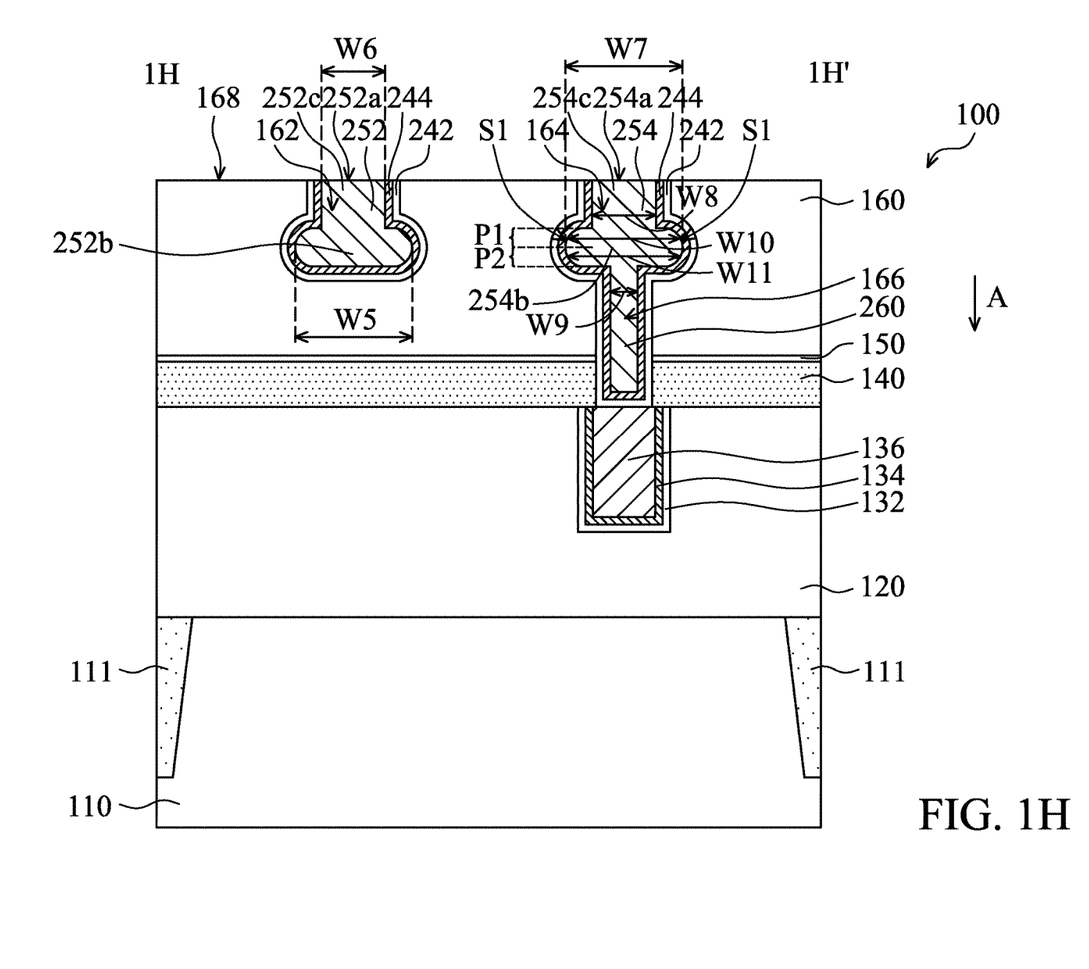
Figure 2A:
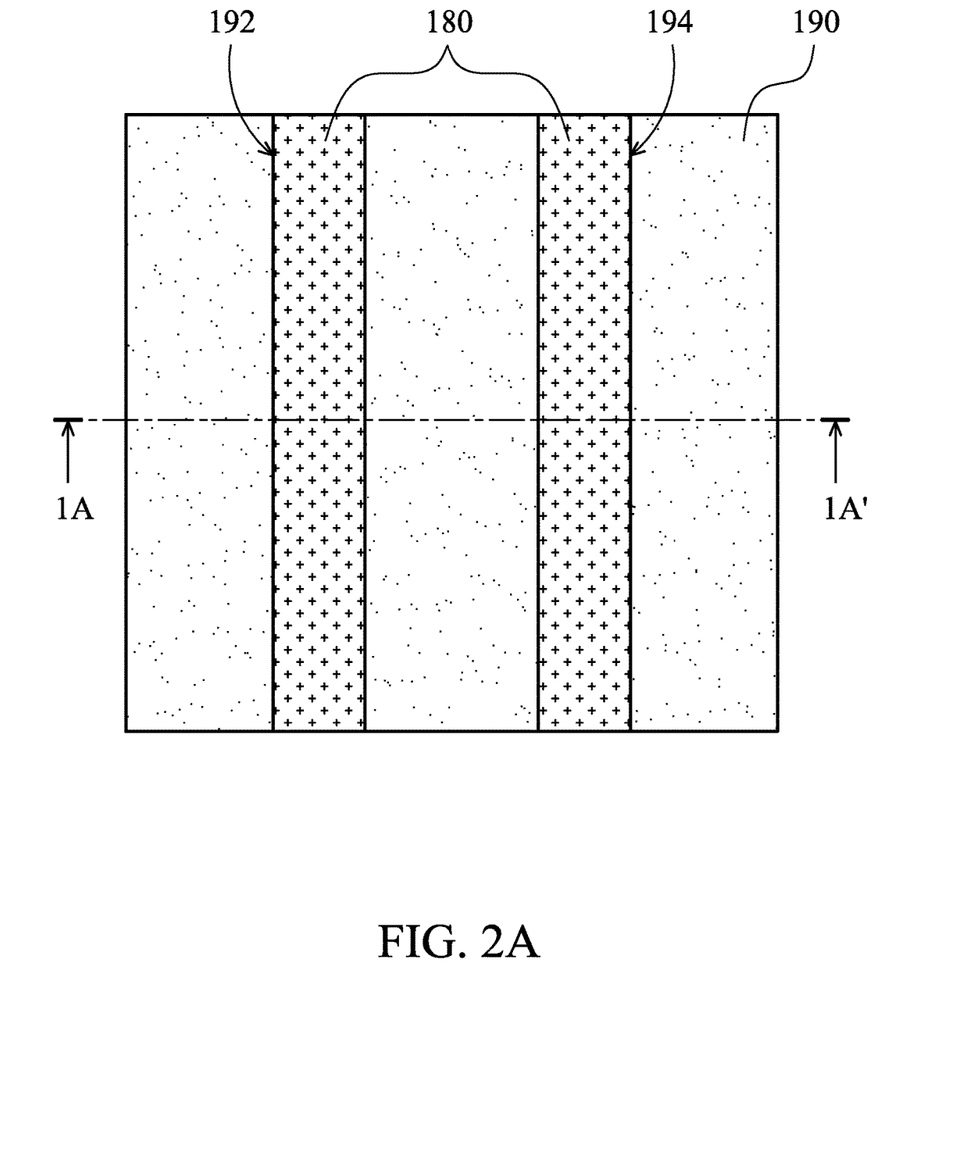
FIGS. 2A-2C are top views of the structures in FIGS. 1A-1B and 1H, respectively, in accordance with some embodiments.
Figure 2B:
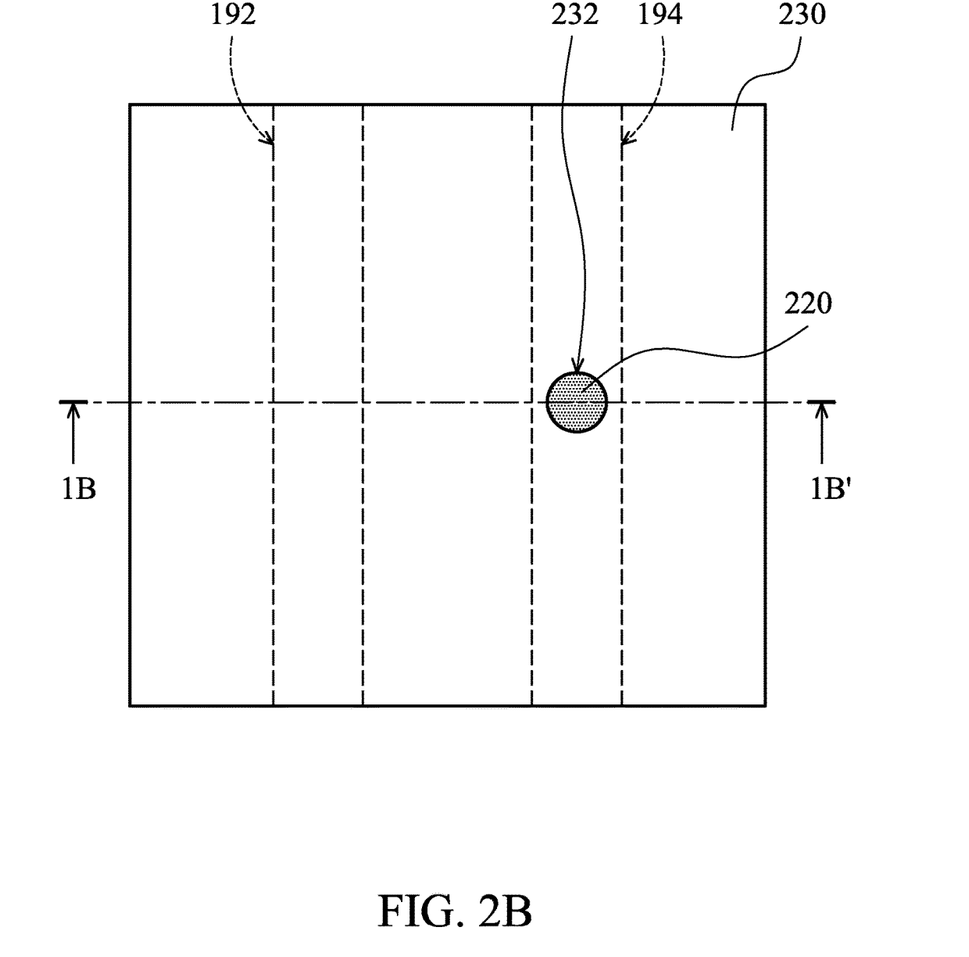
Figure 2C:
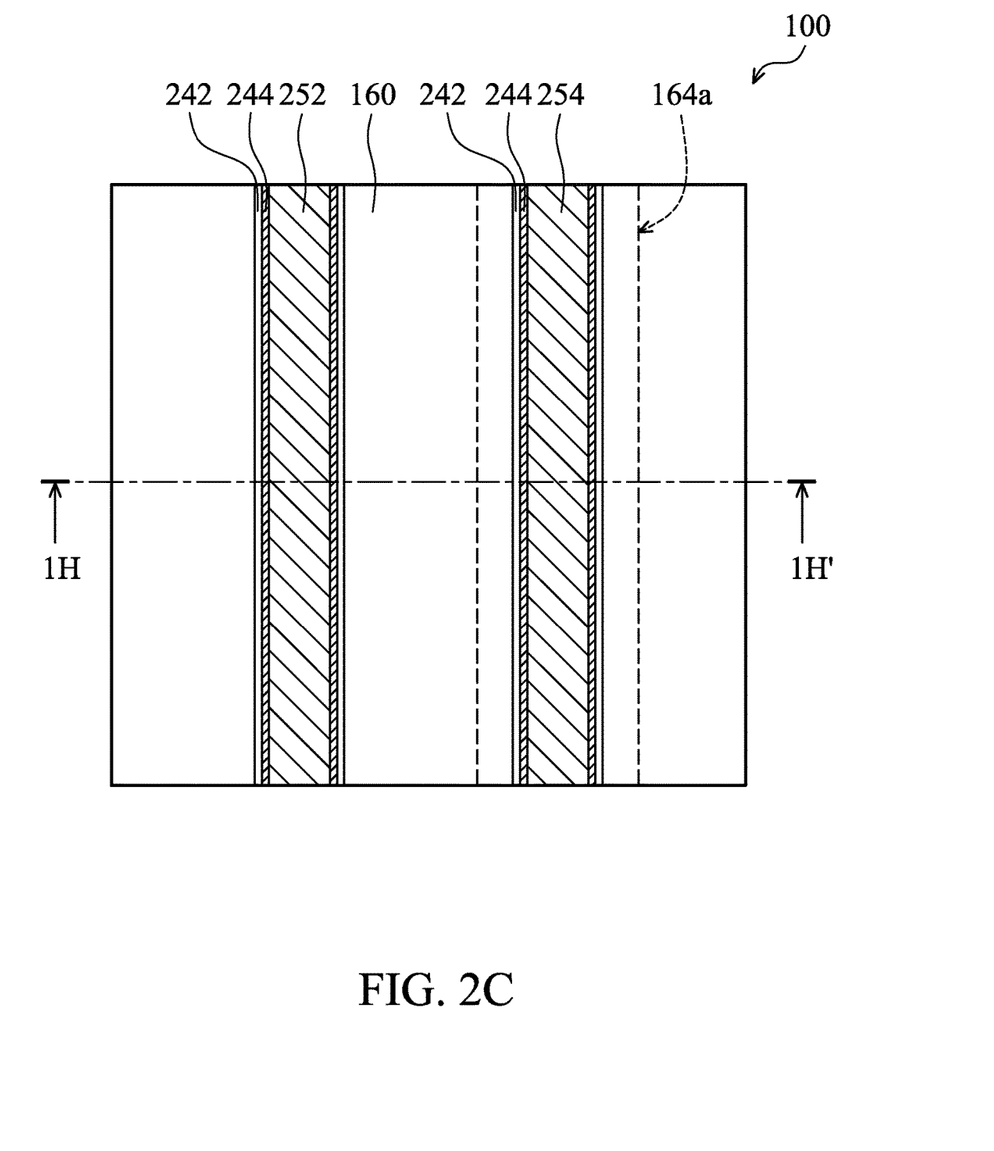

FIGS. 1A-1H are cross-sectional views of various stages of a process for forming a semiconductor device structure 100, in accordance with some embodiments. FIGS. 2A-2C are top views of the structures in FIGS. 1A-1B and 1H, respectively, in accordance with some embodiments. FIGS. 1A-1B and 1H are cross-sectional views illustrating the structures along sectional lines 1A-1A', 1B-1B', and 1H-1H' in FIGS. 2A-2C, respectively, in accordance with some embodiments.

As shown in FIG. 1A, a substrate 110 is provided, in accordance with some embodiments. The substrate 110 may be a semiconductor wafer such as a silicon wafer. Alternatively or additionally, the substrate 110 may include elementary semiconductor materials, compound semiconductor materials, and/or alloy semiconductor materials.

Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

As shown in FIG. 1A, an isolation structure 111 is formed in the semiconductor substrate 110, in accordance with some embodiments. The isolation structure 111 surrounds a device region of the semiconductor substrate 110, in accordance with some embodiments. The isolation structure 111 is configured to define and electrically isolate various device elements (not shown) formed in the semiconductor substrate 110, in accordance with some embodiments.

Examples of device elements may include, but are not limited to, transistors, diodes, and/or other applicable elements. Examples of the transistors may include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), or the like. Various processes are performed to form the device elements, such as deposition, etching, implantation, photolithography, annealing, and/or other applicable processes.

As shown in FIG. 1A, a dielectric layer 120 is formed over the substrate 110 and the isolation structure 111, in accordance with some embodiments. The dielectric layer 120 includes dielectric materials, in accordance with some embodiments. Examples of the dielectric materials may include, but are not limited to, oxide, SiO$_2$, borophosphosilicate glass (BPSG), spin on glass (SOG), undoped silicate glass (USG), fluorinated silicate glass (FSG), high-density plasma (HDP) oxide, or plasma-enhanced TEOS (PE-TEOS).

The dielectric layer 120 may include multilayers made of multiple dielectric materials, such as a low dielectric constant or an extreme low dielectric constant (ELK) material. The dielectric layer 120 may be formed by chemical vapor deposition (CVD), physical vapor deposition (PVD), atomic layer deposition (ALD), spin-on coating, or another applicable process.

As shown in FIG. 1A, a trench 122 is formed in the dielectric layer 120, in accordance with some embodiments. The trench 122 is formed using a photolithography process and an etching process, in accordance with some embodiments. As shown in FIG. 1A, a barrier layer 132 is formed in the trench 122, in accordance with some embodiments. The barrier layer 132 conformally covers inner walls 122*a* and a bottom surface 122*b* of the trench 122, in accordance with some embodiments. The barrier layer 132 is configured to prevent diffusion of metal materials formed in the trench 122 into the dielectric layer 120, in accordance with some embodiments. The barrier layer 132 includes tantalum or another suitable material. The barrier layer 132 is formed using a physical vapor deposition process, in accordance with some embodiments.

As shown in FIG. 1A, a seed layer 134 is formed over the barrier layer 132, in accordance with some embodiments. The seed layer 134 includes copper (Cu) and manganese (Mn) or other suitable materials. The seed layer 134 is formed using a physical vapor deposition process, in accordance with some embodiments. As shown in FIG. 1A, a conductive line 136 is formed in the trench 122 and over the seed layer 134, in accordance with some embodiments. The conductive line 136 includes aluminum (Al), copper (Cu), or another suitable material. The conductive line 136 is formed using a plating process, in accordance with some embodiments.

As shown in FIG. 1A, a dielectric layer 140 is formed over the dielectric layer 120, the barrier layer 132, the seed layer 134, and the conductive line 136, in accordance with some embodiments. The dielectric layer 140 is configured to prevent diffusion of metal materials of the conductive line 136 into a dielectric layer formed thereover, in accordance with some embodiments.

The dielectric layer 140 includes dielectric materials, in accordance with some embodiments. The dielectric layer 140 includes silicon carbide, silicon nitride, or another suitable dielectric material. The dielectric layers 120 and 140 are made of different materials, in accordance with some embodiments. The dielectric layer 140 may include multilayers made of different dielectric materials. The dielectric layer 140 may be formed by chemical vapor deposition (CVD), physical vapor deposition (PVD), atomic layer deposition (ALD), spin-on coating, or another applicable process.

As shown in FIG. 1A, an adhesive layer 150 is formed over the dielectric layer 140, in accordance with some embodiments. The adhesive layer 150 is configured to adhere the dielectric layer 140 to another dielectric layer thereon. The adhesive layer 150 includes tetraethoxysilane (TEOS) or another suitable material. In some other embodiments, the adhesive layer 150 is not formed.

As shown in FIG. 1A, a dielectric layer 160 is formed over the adhesive layer 150, in accordance with some embodiments. The dielectric layers 160 and 140 are made of different materials, such that the dielectric layers 160 and 140 can have etching selectivity in subsequent etching processes, in accordance with some embodiments. The dielectric layers 160 and 140 and the adhesive layer 150 are made of different materials, in accordance with some embodiments.

The dielectric layer 160 includes dielectric materials, in accordance with some embodiments. Examples of the dielectric materials may include, but are not limited to, oxide, SiO$_2$, borophosphosilicate glass (BPSG), spin on glass (SOG), undoped silicate glass (USG), fluorinated silicate glass (FSG), high-density plasma (HDP) oxide, or plasma-enhanced TEOS (PETEOS).

The dielectric layer 160 may include multilayers made of multiple dielectric materials, such as a low dielectric constant or an extreme low dielectric constant (ELK) material. The dielectric layer 160 may be formed by chemical vapor deposition (CVD), physical vapor deposition (PVD), atomic layer deposition (ALD), spin-on coating, or another applicable process.

As shown in FIG. 1A, an etching stop layer 170 is formed over the dielectric layer 160, in accordance with some embodiments. The etching stop layer 170 includes silicon nitride, silicon oxide, or another suitable material. The etching stop layer 170 is formed using a chemical vapor deposition process, in accordance with some embodiments.

As shown in FIG. 1A, a mask layer 180 is formed over the etching stop layer 170, in accordance with some embodiments. In some embodiments, the mask layer 180 includes oxide, such as silicon oxide. In some embodiments, the mask layer 180 includes silicon nitride, titanium nitride, other applicable materials, or a combination thereof. In some embodiments, the mask layer 180 is formed using a chemical vapor deposition process.

As shown in FIGS. 1A and 2A, a hard mask layer 190 is formed over the mask layer 180, in accordance with some embodiments. The hard mask layer 190 has trenches 192 and 194, in accordance with some embodiments. The trenches 192 and 194 expose a portion of the mask layer 180, in accordance with some embodiments.

Examples of a material for the hard mask layer 190 include, but are not limited to, silicon oxide, silicon nitride (e.g., Si$_3$N$_4$), SiON, SiC, SiOC, or a combination thereof. The hard mask layer 190 may be formed by chemical vapor deposition (CVD), physical vapor deposition (PVD), atomic layer deposition (ALD), spin-on coating, or another applicable process. In some embodiments, the mask layer 180 and the hard mask layer 190 are made of different materials, such that the mask layer 180 and the hard mask layer 190 can have etching selectivity in subsequent etching processes.

As shown in FIGS. 1B and 2B, a cover layer 210 is formed over the hard mask layer 190 and filled into the trenches 192 and 194, in accordance with some embodiments. The cover layer 210 is made of a polymer material or another suitable material. The cover layer 210 is formed by a coating process, a CVD process, or another suitable process.

As shown in FIGS. 1B and 2B, a middle layer 220 is formed over the cover layer 210, in accordance with some embodiments. In some embodiments, the middle layer 220 is made of a silicon-containing material (e.g., a silicon-containing polymer material). In some embodiments, the mask layer 180, the hard mask layer 190, the cover layer 210, and the middle layer 220 are made of different materials, such that they can have etching selectivity in etching processes performed afterwards. The middle layer 220 is formed by a coating process, a CVD process, or another suitable process.

As shown in FIGS. 1B and 2B, a photoresist layer 230 is formed over the middle layer 220, in accordance with some embodiments. The photoresist layer 230 has an opening 232 exposing a portion of the middle layer 220, in accordance with some embodiments. The photoresist layer 230 is made of a photoresist material, in accordance with some embodiments. The photoresist layer 230 is formed by, for example, a coating process and a photolithography process.

As shown in FIG. 1C, the portion of the middle layer 220 and the cover layer 210 under the opening 232 are removed through the opening 232, in accordance with some embodiments. After the removal process, an opening 212 passing through the middle layer 220 and the cover layer 210 is formed, in accordance with some embodiments. The opening 212 is connected to the opening 232 and exposes a portion of the mask layer 180, in accordance with some embodiments. The opening 212 is positioned in the trench 194, in accordance with some embodiments. The removal process includes a dry etching process, in accordance with some embodiments.

As shown in FIG. 1D, the middle layer 220 and the photoresist layer 230 are removed, in accordance with some embodiments. The removal process includes a dry etching process or a wet etching process, in accordance with some embodiments. Thereafter, the portion of the mask layer 180 is removed through the opening 212, in accordance with some embodiments. After the removal process, an opening 182 is formed in the mask layer 180 and exposes a portion of the etching stop layer 170, in accordance with some embodiments.

The removal process includes a dry etching process, in accordance with some embodiments. The dry etching process includes a plasma etching process, in accordance with some embodiments. The plasma etching process is performed under a pressure ranging from about 1 mTorr to about 100 mTorr and using power ranging from about 100 W to about 1500 W, in accordance with some embodiments. The plasma etching process is performed at a temperature ranging from about 10° C. to about 70° C., in accordance with some embodiments. The plasma etching process uses a gas including $CF_4$, $H_2$, $N_2$, $C_4F_8$, $O_2$, and/or $CH_2F_2$, in accordance with some embodiments.

As shown in FIG. 1E, the cover layer 210 is removed, in accordance with some embodiments. The removal process includes a dry etching process, in accordance with some embodiments. The dry etching process includes a plasma etching process, in accordance with some embodiments. The plasma etching process is performed under a pressure ranging from about 1 mTorr to about 100 mTorr and using power ranging from about 100 W to about 1500 W, in accordance with some embodiments. The plasma etching process is performed at a temperature ranging from about 10° C. to about 70° C., in accordance with some embodiments. The plasma etching process uses a gas including $CO_2$, $C_4H_8$, $CF_4$, $O_2$, $N_2$, and/or Ar, in accordance with some embodiments.

As shown in FIG. 1F, an etching process is performed to remove portions of the mask layer 180, the etching stop layer 170, the dielectric layer 160 under the trench 192 and portions of the mask layer 180, the etching stop layer 170, the dielectric layer 160, the adhesive layer 150, and the dielectric layer 140 under the trench 194, in accordance with some embodiments.

After the etching process, trenches 162 and 164 and a via hole 166 are formed in the dielectric layer 160, in accordance with some embodiments. The via hole 166 also passes through the adhesive layer 150 and the dielectric layer 140, in accordance with some embodiments. The via hole 166 is under the trench 164 and connected to the trench 164, in accordance with some embodiments. The via hole 166 exposes a portion of the conductive line 136, in accordance with some embodiments.

The trench 162 has a first portion 162a and a second portion 162b over the first portion 162a, in accordance with some embodiments. In some embodiments, a width W1 of the first portion 162a is greater than a width W2 of the second portion 162b. Similarly, the trench 164 has a first portion 164a and a second portion 164b over the first portion 164a, in accordance with some embodiments.

In some embodiments, a width W3 of the first portion 164a is greater than a width W4 of the second portion 164b. In some embodiments, the width W4 of the second portion 164b is greater than a width $W_v$ of the via hole 166. In some embodiments, the first portions 162a and 164a are adjacent to the substrate 110, and the second portions 162b and 164b are adjacent to an upper surface 168 of the dielectric layer 160.

In some embodiments, the trench 164 has inner walls 164c and 164d opposite to each other. The inner wall 164c has a recess R1 facing the first portion 164a, in accordance with some embodiments. The inner wall 164d has a recess R2 facing the first portion 164a, in accordance with some embodiments. The recesses R1 and R2 are opposite to each other, in accordance with some embodiments. The first portion 164a is between the recesses R1 and R2, in accordance with some embodiments. The recesses R1 and R2 have inner walls 164e and 164f, respectively, in accordance with some embodiments. The inner walls 164e and 164f are curved inner walls, in accordance with some embodiments.

The etching process includes a dry etching process, in accordance with some embodiments. The dry etching process includes a plasma etching process, in accordance with some embodiments. The plasma etching process is performed under a pressure ranging from about 1 mTorr to about 100 mTorr and using power ranging from about 100 W to about 1500 W, in accordance with some embodiments. The plasma etching process is performed at a temperature ranging from about 10° C. to about 70° C., in accordance with some embodiments. The plasma etching process uses a gas including $C_4F_8$, $CF_4$, $O_2$, $N_2$, and/or Ar, in accordance with some embodiments.

As shown in FIG. 1G, a barrier layer 242 is formed in the trenches 162 and 164, and the via hole 166, in accordance with some embodiments. The barrier layer 242 conformally covers the inner walls 162c, 164c, 164d, and 166a of the trenches 162 and 164 and the via hole 166 and bottom surfaces 162d and 164g of the trenches 162 and 164, in accordance with some embodiments.

The barrier layer 242 is configured to prevent diffusion of metal materials formed in the trenches 162 and 164 and the via hole 166 into the dielectric layers 140 and 160 and the adhesive layer 150, in accordance with some embodiments. The barrier layer 242 includes tantalum or another suitable material. The barrier layer 242 is formed using a physical vapor deposition process, in accordance with some embodiments.

As shown in FIG. 1G, a seed layer 244 is formed over the barrier layer 242, in accordance with some embodiments. The seed layer 244 includes copper (Cu) and manganese (Mn) or other suitable materials. The seed layer 244 is formed using a physical vapor deposition process, in accordance with some embodiments.

As shown in FIG. 1G, a conductive layer 246 is formed in the trenches 162 and 164 and the via hole 166 and over the seed layer 244, in accordance with some embodiments. The conductive layer 246 includes conductive materials, such as aluminum (Al), copper (Cu), or another suitable material. The conductive layer 246 is formed using a plating process, in accordance with some embodiments.

As shown in FIGS. 1H and 2C, the barrier layer 242, the seed layer 244, and the conductive layer 246 outside of the trenches 162 and 164 and the via hole 166, the mask layer 180, and the hard mask layer 190 are removed, in accordance with some embodiments. The removal process includes a planarization process, such as a chemical mechanical polishing process, in accordance with some embodiments.

The conductive layer 246 remaining in the trench 162 forms a conductive line 252, in accordance with some embodiments. The conductive layer 246 remaining in the trench 164 forms a conductive line 254, in accordance with some embodiments. In some embodiments, the upper surface 252a of the conductive line 252, the upper surface 254a of the conductive line 254, and the upper surface 168 of the dielectric layer 160 are coplanar with each other.

The conductive line 252 has a first end portion 252b and a second end portion 252c, in accordance with some embodiments. The first end portion 252b faces the substrate 110, in accordance with some embodiments. The second end portion 252c faces away from the substrate 110, in accordance with some embodiments. A width W5 of the first end portion 252b is greater than a width W6 of the second end portion 252c, in accordance with some embodiments.

The conductive line 254 has a first end portion 254b and a second end portion 254c, in accordance with some embodiments. The first end portion 254b faces the substrate 110, in accordance with some embodiments. The second end portion 254c faces away from the substrate 110, in accordance with some embodiments. A width W7 of the first end portion 254b is greater than a width W8 of the second end portion 254c, in accordance with some embodiments. The first end portion 254b has sidewalls S1, in accordance with some embodiments. The sidewalls S1 are curved sidewalls, in accordance with some embodiments.

The first end portion 254b has an upper portion P1 and a lower portion P2, in accordance with some embodiments. A width W10 of the upper portion P1 increases in a direction A toward the substrate 110, in accordance with some embodiments. In some embodiments, the width W10 of the upper portion P1 continuously increases in the direction A. In some embodiments, a width W11 of the lower portion P2 decreases in the direction A toward the substrate 110.

The conductive layer 246 remaining in the via hole 166 forms a conductive via structure 260, in accordance with some embodiments. The conductive via structure 260 is an integral structure, in accordance with some embodiments. The conductive line 254 is in the dielectric layer 160 and over the conductive via structure 260, in accordance with some embodiments. The conductive line 254 and the conductive via structure 260 are formed into an integral structure, in accordance with some embodiments.

The conductive via structure 260 passes through the dielectric layer 140 and penetrates into the dielectric layer 160 under the conductive line 254, in accordance with some embodiments. The conductive via structure 260 further passes through the adhesive layer 150, in accordance with some embodiments.

The conductive via structure 260 is connected to the first end portion 254b, in accordance with some embodiments. The width W8 of the second end portion 254c is greater than a width W9 of the conductive via structure 260, in accordance with some embodiments. The conductive line 136 is under the conductive via structure 260 and electrically connected to the conductive via structure 260, in accordance with some embodiments.

According to the above description, the width W7 of the first end portion 254b is greater than a width W8 of the second end portion 254c. That is, the conductive line 254 has an enlarged end portion (i.e. the first end portion 254b). Therefore, the probability of connecting the conductive line 254 with the enlarged end portion 254b to the conductive via structure 260 is increased. As a result, the yield is improved. Furthermore, the enlarged end portion 254b is able to reduce the sheet resistance of the conductive line 254.

In some embodiments, the difference between the width W7 and the width W8 ranges from about 2 nm to about 10 nm. In some embodiments, a ratio of the width W7 to the width W8 ranges from about 1.1 to about 1.4.

Figure 3:
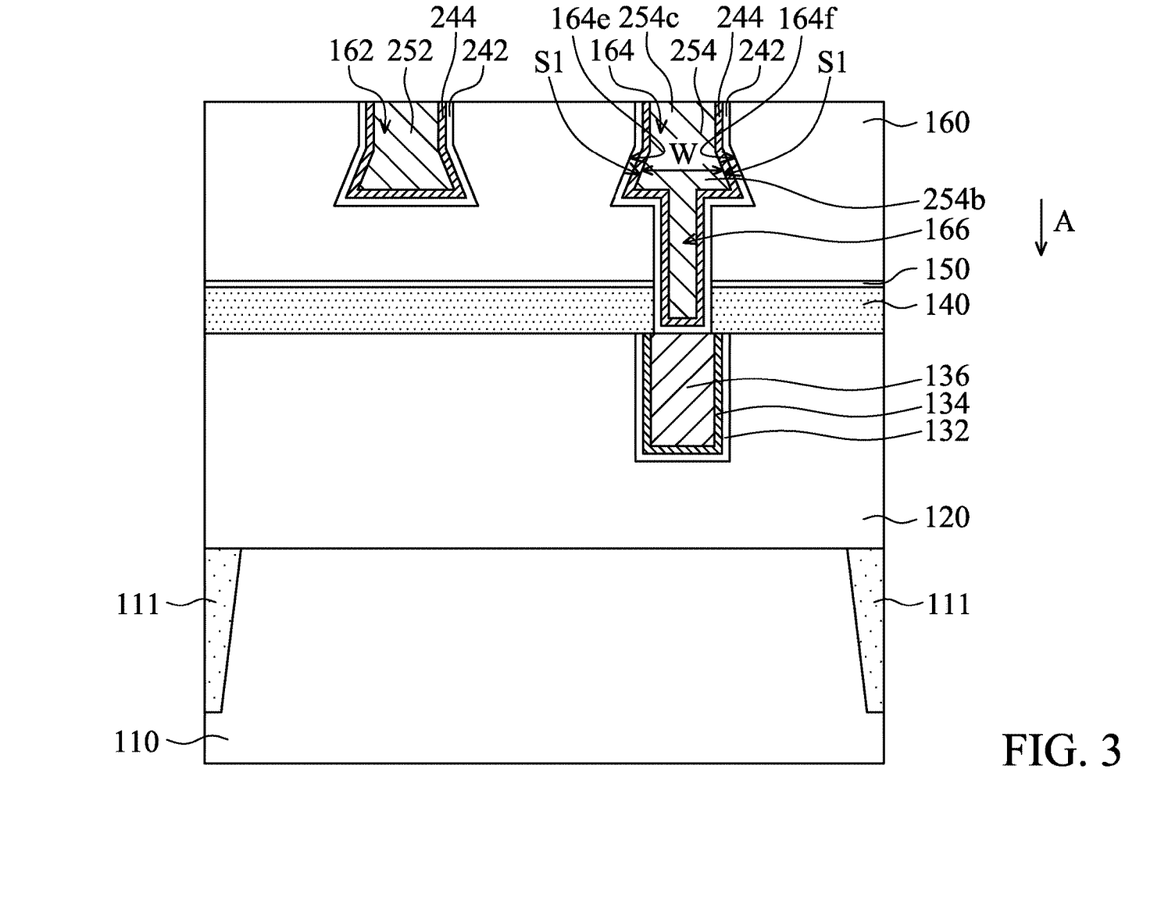
FIG. 3 is a cross-sectional view of a semiconductor device structure, in accordance with some embodiments.

As shown in FIGS. 1F and 1H, the inner walls 164e and 164f are curved inner walls, and the sidewalls S1 are curved sidewalls, in accordance with some embodiments. In some other embodiments, the inner walls 164e and 164f are planar inner walls, and the sidewalls S1 are planar sidewalls (as shown in FIG. 3). As shown in FIG. 3, the width W of the first end portion 254b increases in the direction A toward the substrate 110, in accordance with some embodiments. In some embodiments, the width W of the whole first end portion 254b increases in the direction A toward the substrate 110.

Figure 4:
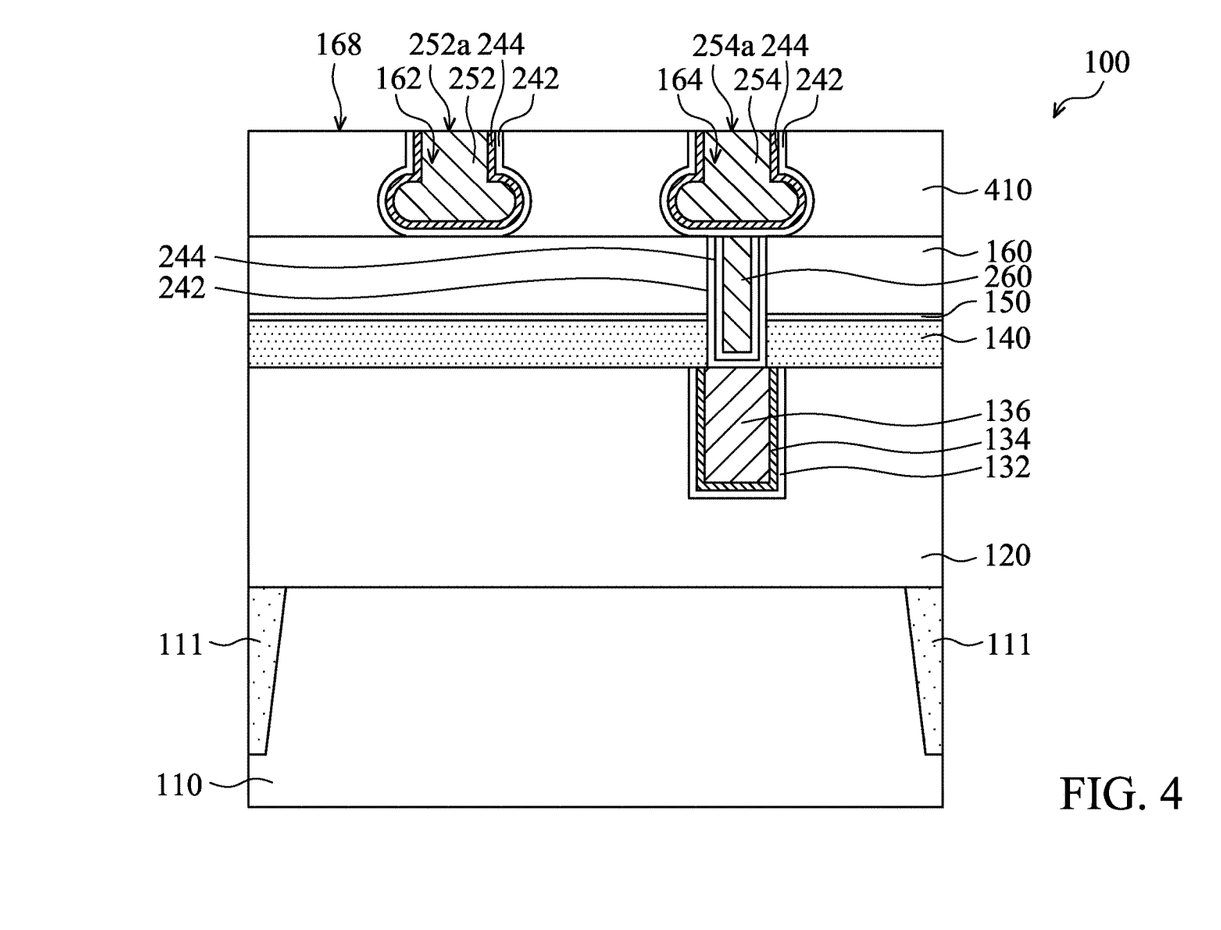
FIG. 4 is a cross-sectional view of a semiconductor device structure, in accordance with some embodiments.

Referring to FIG. 1H, the conductive lines 252 and 254 and the conductive via structure 260 are formed in the same dielectric layer 160, in accordance with some embodiments. In some other embodiments, the conductive lines 252 and 254 and the conductive via structure 260 are formed in different dielectric layers 410 and 160 (as shown in FIG. 4), in accordance with some embodiments. As shown in FIG. 4, the conductive via structure 260 passes through the dielectric layer 160, the adhesive layer 150, and the dielectric layer 140, in accordance with some embodiments.

In accordance with some embodiments, semiconductor device structures and methods for forming the same are provided. The methods (for forming the semiconductor device structure) form a conductive line with an enlarged end portion. Therefore, the probability of connecting the conductive line with the enlarged end portion to a conductive structure thereunder is increased. As a result, the yield is improved. Furthermore, the enlarged end portion is able to reduce the sheet resistance of the conductive line.

In accordance with some embodiments, a semiconductor device structure is provided. The semiconductor device structure includes a substrate. The semiconductor device structure includes a dielectric layer over the substrate. The dielectric layer has a trench. The semiconductor device structure includes a conductive line in the trench. The conductive line has a first end portion and a second end portion. The first end portion faces the substrate. The second end portion faces away from the substrate. A first width of the first end portion is greater than a second width of the second end portion.

In accordance with some embodiments, a semiconductor device structure is provided. The semiconductor device structure includes a substrate. The semiconductor device structure includes a dielectric layer over the substrate. The dielectric layer has a trench. The trench has a first portion and a second portion over the first portion, and a first width of the first portion is greater than a second width of the second portion. The semiconductor device structure includes a conductive line filled in the trench.

In accordance with some embodiments, a method for forming a semiconductor device structure is provided. The method includes forming a dielectric layer over a substrate. The method includes forming a first trench in the dielectric layer. The first trench has a first portion and a second portion over the first portion, and a first width of the first portion is greater than a second width of the second portion. The method includes filling a conductive material into the first trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a substrate;
a dielectric layer over the substrate, wherein the dielectric layer has a trench;
a conductive line in the trench, wherein the conductive line has a first end portion and a second end portion, the first end portion faces the substrate, the second end portion faces away from the substrate, and a first width of the first end portion is greater than a second width of the second end portion; and
a conductive via structure formed in the dielectric layer under the conductive line and connected to the first end portion.

2. The semiconductor device structure as claimed in claim 1, wherein the second width of the second end portion is greater than a third width of the conductive via structure.

3. The semiconductor device structure as claimed in claim 1, wherein the first end portion has a curved sidewall.

4. The semiconductor device structure as claimed in claim 3, wherein the first end portion has an upper portion and a lower portion, and a third width of the upper portion increases in a direction toward the substrate.

5. The semiconductor device structure as claimed in claim 4, wherein the third width of the upper portion continuously increases in the direction toward the substrate.

6. The semiconductor device structure as claimed in claim 4, wherein a fourth width of the lower portion decreases in the direction toward the substrate.

7. The semiconductor device structure as claimed in claim 1, wherein the first end portion has a planar sidewall.

8. The semiconductor device structure as claimed in claim 1, wherein the first width of the first end portion increases in a direction toward the substrate.

9. A semiconductor device structure, comprising:
a substrate;
a dielectric layer over the substrate, wherein the dielectric layer has a trench and a via hole under and connected to the trench, the trench has a first portion and a second portion over the first portion, the first portion is between the via hole and the second portion, and a first width of the first portion is greater than a second width of the second portion;
a conductive line filled in the trench; and
a conductive via structure filled in the via hole and connected to the conductive line.

10. The semiconductor device structure as claimed in claim 9, wherein the first portion is adjacent to the substrate, and the second portion is adjacent to an upper surface of the dielectric layer.

11. The semiconductor device structure as claimed in claim 9, wherein the trench has a first inner wall, and the first inner wall has a first recess facing the first portion.

12. The semiconductor device structure as claimed in claim 9, wherein the second width of the second portion is greater than a third width of the via hole.

13. The semiconductor device structure as claimed in claim 11, wherein the first recess has a curved inner wall.

14. The semiconductor device structure as claimed in claim 11, wherein the first recess has a planar inner wall.

15. A method for forming a semiconductor device structure, comprising:
forming a dielectric layer over a substrate;
forming a first trench in the dielectric layer, wherein the first trench has a first portion and a second portion over the first portion, and a first width of the first portion is greater than a second width of the second portion;
filling a conductive material into the first trench;
during the formation of the first trench, forming a via hole in the dielectric layer under the trench, wherein the via hole is connected to the trench; and
during the filling of the conductive material into the first trench, filling the conductive material into the via hole.

16. The method for forming a semiconductor device structure as claimed in claim 15, wherein the formation of the first trench comprises:
forming a mask layer over the dielectric layer, wherein the mask layer has a second trench exposing a portion of the dielectric layer; and
performing a dry etching process to remove the portion of the dielectric layer.

17. The method for foisting a semiconductor device structure as claimed in claim 16, wherein the dry etching process comprises a plasma etching process.

18. The method for forming a semiconductor device structure as claimed in claim 15, wherein the second width of the second portion is greater than a third width of the via hole.

19. The semiconductor device structure as claimed in claim 1, further comprising:
a first dielectric layer between the dielectric layer and the substrate, wherein the conductive via structure passes through the first dielectric layer.

20. The semiconductor device structure as claimed in claim 9, wherein the dielectric layer is a multilayer structure, the dielectric layer has a first layer and a second layer, the first layer is between the second layer and the substrate, the trench is in the second layer, and the via hole is in the first layer.

* * * * *